United States Patent
Lefort

(10) Patent No.: US 12,279,695 B2
(45) Date of Patent: Apr. 22, 2025

(54) SELF ALIGNING WALL RAIL FOR ENCLOSURE WALL MOUNTING

(71) Applicant: ABB Schweiz AG, Baden (CH)

(72) Inventor: Maxime Lefort, Iberville (CA)

(73) Assignee: ABB SCHWEIZ AG, Baden (CH)

( * ) Notice: Subject to any disclaimer, the term of this patent is extended or adjusted under 35 U.S.C. 154(b) by 519 days.

(21) Appl. No.: 17/559,661

(22) Filed: Dec. 22, 2021

(65) Prior Publication Data
US 2023/0194573 A1    Jun. 22, 2023

(51) Int. Cl.
*A47B 95/00* (2006.01)
*F16M 13/02* (2006.01)
*G01R 11/04* (2006.01)

(52) U.S. Cl.
CPC ........... *A47B 95/008* (2013.01); *F16M 13/02* (2013.01); *G01R 11/04* (2013.01)

(58) Field of Classification Search
CPC ..... A47B 95/008; A47B 96/067; A47B 96/06; A47B 97/001; A47B 96/14; A47B 96/068; A47F 5/0853; A47F 5/08; A47F 5/0846; A47F 5/0892; A47F 5/0838; A47F 5/0006; H02B 1/40; G01R 11/04; F16M 13/02
See application file for complete search history.

(56) References Cited

U.S. PATENT DOCUMENTS

| | | | | |
|---|---|---|---|---|
| 2,521,134 A | * | 9/1950 | Stanitz | A47B 95/008 312/107 |
| 3,950,049 A | * | 4/1976 | Drass | A47B 96/06 312/198 |
| 4,328,903 A | * | 5/1982 | Baars | H02G 3/10 220/3.9 |
| 4,329,003 A | * | 5/1982 | Manchester | A47B 97/001 312/263 |
| 4,996,801 A | * | 3/1991 | Ristow | E04D 13/1415 52/273 |
| 5,050,832 A | * | 9/1991 | Lee | A47B 95/008 248/222.51 |
| 5,624,168 A | * | 4/1997 | Licciardello, Sr. | A47B 95/008 211/94.01 |
| 5,718,493 A | * | 2/1998 | Nikolai | A47B 88/941 403/68 |
| 5,794,903 A | * | 8/1998 | Peterson, II | A47B 97/00 248/300 |

(Continued)

FOREIGN PATENT DOCUMENTS

DE    102010027178 A1 *  1/2012  ........... A47B 96/067

*Primary Examiner* — Hiwot E Tefera
(74) *Attorney, Agent, or Firm* — Greenberg Traurig, LLP

(57) ABSTRACT

The enclosure mounting system is for hanging enclosures and includes a wall rail and a hanging rail. The enclosure mounting system can include an enclosure and a pair of rotary footings. The wall rail has a wave form pattern profile extending from a first end to a second end and is configured to mount to a surface. The hanging rail is configured to hang onto the mounted wall rail. The wall rail can include an at least one end segment that receives an end of a second wall rail. The at least one end segment receives a central segment of the second wall rail and the corresponding wave form pattern profile promotes self-aligning. The second wall rail is further aligned to the first wall rail by mounting the at least one end segment, with an end of the central segment of the second wall rail, to the surface.

18 Claims, 12 Drawing Sheets

(56) References Cited

U.S. PATENT DOCUMENTS

| | | | |
|---|---|---|---|
| 6,761,521 B2 | 7/2004 | McCormack et al. | |
| 7,040,921 B2 | 5/2006 | Kellerman | |
| 7,209,021 B2 | 4/2007 | Clement | |
| 7,358,441 B1 | 4/2008 | Seff et al. | |
| 7,400,495 B1 | 7/2008 | Ranta et al. | |
| 7,416,421 B2 | 8/2008 | Kapinos et al. | |
| 7,522,406 B2 | 4/2009 | Seff et al. | |
| 8,182,282 B2 | 5/2012 | Baca et al. | |
| 9,560,786 B2 | 1/2017 | Chen et al. | |
| 9,768,540 B2 | 9/2017 | Cable | |
| 10,488,063 B2 | 11/2019 | Niculescu et al. | |
| 2006/0000629 A1 | 1/2006 | Johnson et al. | |
| 2006/0091271 A1* | 5/2006 | Nowak | A47B 95/008 248/225.21 |
| 2007/0171602 A1 | 7/2007 | Seff et al. | |
| 2011/0025180 A1* | 2/2011 | Ilich | A47B 95/008 29/428 |
| 2011/0147551 A1* | 6/2011 | Richard | A47B 96/067 29/428 |
| 2011/0309731 A1* | 12/2011 | Lindvall | A47B 95/008 312/352 |
| 2012/0291261 A1* | 11/2012 | Davis | F16B 12/50 403/292 |
| 2014/0068921 A1 | 3/2014 | Tseng | |
| 2016/0045025 A1* | 2/2016 | Trunkle | F16M 13/02 248/231.91 |
| 2017/0143120 A1* | 5/2017 | Cattaneo | A47B 95/008 |
| 2018/0332964 A1* | 11/2018 | McKenzie | A47B 83/001 |
| 2019/0109442 A1* | 4/2019 | Mevius | H02B 1/44 |
| 2020/0113329 A1* | 4/2020 | Nilsson | F16B 7/0473 |
| 2022/0257014 A1* | 8/2022 | Tooley | A47B 95/008 |

* cited by examiner

SELF ALIGNING WALL RAIL FOR ENCLOSURE WALL MOUNTING

FIELD

This disclosure relates generally to electrical systems. More particularly, this disclosure relates to wall rails for aligning and hanging enclosures, such as, but not limited to, electrical metering modules.

BACKGROUND

When mounting an electrical enclosure to a surface, wall rails can be utilized to mount the enclosure to the surface. Further, when adjoining multiple enclosures to the surface, a plurality of wall rails can be utilized. However, when installing multiple adjoining enclosures, proper leveling and alignment of adjoining enclosures ensures proper alignment of the electrical components that traverse between adjoining enclosures. Consequently, each wall rail is individually aligned and leveled to the preceding wall rail when mounting multiple enclosures, leading to extra manufacturing steps and increased risk of misalignment. Improved wall rails are desirable.

SUMMARY

Embodiments of this disclosure are directed to an enclosure mounting system for aligning and mounting enclosures to a surface. The enclosure mounting system can include a wall rail and a hanging rail. The wall rail is defined by a wave form pattern profile configured to self-align adjoining wall rails to provide for level mounting of multiple enclosures. The wall rail can include a central segment defined by a mounting rail, a first rail, a first offset, a second rail, and a second offset, that extend from a first end to a second end of the wall rail. The first offset is disposed between the mounting rail and the first rail on a first side of the mounting rail and the second offset is disposed between the mounting rail and the second rail on a second side of the mounting rail. The central segment can also include a plurality of bores disposed along the width of the mounting rail to mount the wall rail to a surface. In some embodiments, the wall rail can be mounted to the surface with any of a screw, fastener, anchor, rivet, nut, bolt, other means, and a combination thereof. In some embodiments, the wall rail can include a fourth offset and at least one end segment, the fourth offset and the at least one end segment disposed at a first end or a second end of the central segment. In some embodiments, the at least one end segment is configured to connect to an adjoining central segment of a second wall rail. Further, in some embodiments, the central segment can include a channel at the end of the central segment bordering the fourth offset that permits the removal of the at least one end segment from the central segment, thereby exposing an end of the central segment. This allows adjoining wall rails to attach to a first wall rail mounted to a surface. For example, in some embodiments, to install adjoining wall rails, a first wall rail is leveled and mounted to the surface. At least a second wall rail is then aligned and leveled to the first wall rail by detaching an at least one end segment of the second wall rail and exposing the central segment. The exposed central segment is inserted into the opening formed between the at least one end segment of the first wall rail and the surface such that the orientation of the wave form pattern profile of the second wall rail corresponds to the wave form pattern profile of the mounted first wall rail. Therefore, in some embodiments, an advantage of the wave form pattern profile of the wall rail is, but not limited to, that a subsequent wall rail adjoined to a first wall rail, wherein the first wall rail is leveled and mounted to the surface, is leveled and aligned to the first wall rail without having to individually level and align the subsequent wall rails.

The hanging rail can be mounted to a rear surface of an enclosure in order to hang the enclosure to the mounted wall rail. In some embodiments, the hanging rail includes an enclosure rail, a third offset, and a cleat rail, wherein the third offset is disposed between the enclosure rail and the cleat rail. Therefore, the cleat rail extends on a plane parallel to the enclosure rail. To hang the enclosure, the cleat rail is inserted and hung on the cleat formed by the first rail when the wall rail is mounted to the surface.

In some embodiments, a system includes: a wall rail, wherein the wall rail includes: a first end, a second end, a mounting rail, wherein the mounting rail includes: a first side, a second side, wherein the mounting rail extends along a first plane from the first end to the second end, a first offset, wherein the first offset is connected to the mounting rail on the first side, a first rail, wherein the first rail is connected to the first offset opposite the mounting rail and extends along a second plane parallel to the first plane, a second offset, wherein the second offset is connected to the mounting rail on the second side, and a second rail, wherein the second rail is connected to the second offset opposite the mounting rail and the first rail and extends along a third plane parallel to the first plane, wherein the wall rail forms a wave form pattern extending from the first end to the second end; and a hanging rail, wherein the hanging rail includes: an enclosure rail, a third offset, wherein the third offset is connected to a first side of the enclosure rail, and a cleat rail, wherein the cleat rail is connected to the third offset opposite the enclosure rail; wherein the wall rail is configured to mount to a surface; wherein the hanging rail is configured mount to the wall rail by inserting the cleat rail into the cleat formed by the wall rail when the wall rail is mounted to the surface.

In some embodiments, the system further includes: an enclosure, wherein the enclosure is configured to be attached to the enclosure rail and mounted to the surface by hanging the enclosure rail onto the wall rail.

In some embodiments, the enclosure rail further includes: a first end, a second end, and a plurality of bores extending through a surface of the enclosure rail from the first end and the second end, wherein the bores are configured to receive a plurality of connectors to attach the hanging rail to the enclosure.

In some embodiments, the wall rail is a central segment and the wall rail further includes: at least one end segment; wherein the at least one end segment includes: a fourth offset, wherein the fourth offset is connected to the central segment on the first end or the second end of the central segment, an end rail, wherein the end rail includes: at least one alignment bore, wherein the at least one alignment bore is configured to receive a connector to mount the at least one end segment to the surface and the wall rail, wherein the at least one end segment is connected to either the first end or the second end of the central segment, wherein the at least one end segment angularly extends away from the surface when the wall rail is mounted to the surface, a channel, wherein the channel is disposed between the central segment and the at least one end segment, wherein the channel is configured to detach the at least one end segment in response to a shearing force, and a slot, wherein the slot is disposed at the fourth offset between the first rail and the second rail, wherein when the shearing force is applied to the at least one end segment, the at least one end segment breaks off from the central segment at the channel and the slot.

In some embodiments, the central segment is a same width as the enclosure, and wherein the at least one end segment extends from a first side or a second side of the enclosure.

In some embodiments, the central segment of a first wall rail is mounted to the surface and the system further includes: a second wall rail, wherein a central segment of the second wall rail is inserted into an opening formed between the at least one end segment of the first wall rail and the surface such that a wave form pattern profile of the second wall rail matches the first wall rail, wherein the second wall rail aligns with the first wall rail due to the matching wave form pattern profile of the first wall rail and the second wall rail, wherein the second wall rail is further aligned to the first wall rail when the at least one end segment of the first wall rail is mounted to the surface.

In some embodiments, the at least one end segment is a first end segment and a second end segment, wherein the first end segment is disposed at the first end of the central segment, wherein the second end segment is disposed at the second end of the central segment.

In some embodiments, the wall rail is a first wall rail mounted to the surface and the system further includes: a second wall rail, wherein a first end segment or a second end segment is detached from the second wall rail to expose a first end or a second end of a central segment of the second wall rail, wherein the first end or the second end of the central segment of the second wall rail is inserted into the first end segment or the second end segment of the first wall rail, wherein the first wall rail and the second wall rail are aligned due to a matching wave form profile of the first wall rail and the second wall rail, and wherein the second wall rail is further aligned to the first wall rail by mounting the first end segment or the second end segment that has received the second wall rail to the surface.

In some embodiments, the system further includes: a pair of rotary footing mounts, wherein the rotary footing mounts are disposed on a rear surface of the enclosure.

In some embodiments, the mounting rail further includes: a plurality of bores, wherein the plurality of bores extends through the surface of the mounting rail and are disposed from the first end to the second end of the wall rail, and wherein the plurality of bores are configured to receive a plurality of connectors to mount the wall rail to the surface.

In some embodiments, an apparatus includes: a wall rail, wherein the wall rail includes: a mounting rail, wherein the mounting rail includes: a plurality of bores extending through the mounting rail and disposed along the mounting rail, wherein the mounting rail extends on a first plane, a first rail, wherein the first rail includes a first offset, wherein the first rail is connected to the mounting rail and extends on a second plane parallel to the first plane, a second rail, wherein the second rail includes a second offset, wherein the second rail is connected to the mounting rail opposite the first rail and the second rail extends on a third plane parallel to the first plane, wherein the mounting rail, first rail, and the second rail forms a wave form pattern profile extending across the wall rail, wherein the wall rail is configured to mount to a surface; and a hanging rail including: an enclosure rail, wherein the enclosure rail extends on a fourth plane, a cleat rail, wherein the cleat rail is offset from the enclosure rail and extends on a fifth plane parallel to the fourth plane; wherein the hanging rail is configured to mount to the surface by inserting the cleat rail into the cleat formed when the wall rail is mounted to the surface.

In some embodiments, the apparatus further includes: an enclosure, wherein the enclosure is configured to mount to the enclosure rail.

In some embodiments, the wall rail is a central segment and further includes: at least one end segment, wherein the at least one end segment includes: a fourth offset, wherein the fourth offset includes: a slot, wherein the slot is a portion of the mounting rail removed from the fourth offset segment of the wall rail, an end rail, wherein the end rail includes at least one alignment bore disposed on the mounting rail portion of the end rail, wherein the at least one end segment is connected to an end of the central segment at the fourth segment and angularly extends away from the central segment, a channel, wherein the channel is disposed between an end of the central segment and the at least one end segment, wherein the channel is configured to detach the at least one end segment from the central segment in response to a shearing force, and a slot, wherein the slot is disposed between at the fourth offset and is defined by the first rail, the second rail, the central segment, and the at least one end segment, wherein the slot is configured to aid in detaching the at least one end segment from the wall rail in response to the shearing force.

In some embodiments, the central segment of the wall rail is a same width as a width of the enclosure and wherein the at least one end segment extends out from a first side or a second side of the enclosure.

In some embodiments, the at least one end segment is a first end segment and a second end segment, and wherein the first end segment is disposed at the first end of the central segment, wherein the second end segment is disposed at the second end of the central segment.

In some embodiments, the wall rail is a first wall rail mounted to the surface and the apparatus further includes: a second wall rail, wherein a first end segment or a second end segment is detached from the second wall rail to expose a first end or a second end of the second wall rail, wherein the first end or the second end of the second wall rail is inserted into a first end segment or a second end segment of the first wall rail, wherein the first wall rail and the second wall rail are aligned due to a matching wave form profile of the first wall rail and the second wall rail, wherein the second wall rail is further aligned to the first wall rail by mounting the first end segment or the second end segment retaining the second wall rail to the surface.

In some embodiments, the apparatus further includes: a pair of rotary footing mounts, wherein the rotary footing mounts are disposed on a rear surface of the enclosure.

In some embodiments, the enclosure rail further includes: a first end, a second end, and a plurality of bores extending through a surface of the enclosure rail disposed from the first end to the second end, wherein the bores are configured to receive a plurality of connectors to attach the hanging rail to the enclosure.

In some embodiments, the wall rail is a first wall rail and the apparatus further includes: a second wall rail, and a jig having a same profile as the first wall rail and the second wall rail, wherein the first wall rail is mounted and aligned on the surface, wherein the second wall rail is aligned to the first wall rail and mounted to the surface by interconnecting the jig onto an adjoining first end and second end of each of the first wall rail and the second wall rail and mounting the second wall rail to the surface.

In some embodiments, the apparatus further includes: a pair of rotary footing mounts, wherein the rotary footing mounts are disposed on a rear surface of the enclosure and configured to mount to the surface when the enclosure is hung on the wall rail.

BRIEF DESCRIPTION OF THE DRAWINGS

References are made to the accompanying drawings that form a part of this disclosure and that illustrate embodiments in which the systems and methods described in this Specification can be practiced.

Like reference numbers represent the same or similar parts throughout.

DETAILED DESCRIPTION

A "wall rail" as used herein, includes an apparatus capable of mounting to a surface. The wall rail can include a central segment having a wave form pattern profile formed by a first offset and a second offset extending from a first end to a second end of the wall rail. In some embodiments, the wall rail can be a central segment and include a fourth offset and at least one end segment disposed at a first end or a second end of the central segment, wherein the at least one end segment is configured to receive an exposed first end or a second end of a central segment of a second wall rail to mount the second wall rail to the surface. In some embodiments, the wall rail can include two end segments disposed at the first end and the second end of the central segment. In some embodiments, the wall rails can be made of metal. In some embodiments, the width of the wall rail may vary depending on the width of the enclosure being mounted, with the width of the central segment corresponding to the width of the enclosure so that the at least one end segment extends from the side of the enclosure when the enclosure is mounted to the wall rail.

An "hanging rail" as used herein, includes a device capable of mounting to an enclosure to hang the enclosure to the wall rail. The hanging rail can include an enclosure rail, a third offset, and a cleat rail, wherein the third offset is disposed between the enclosure rail and the cleat rail. The enclosure rail abuts a surface of the enclosure when the hanging rail is installed onto the enclosure. In some embodiments, the enclosure rail can include a plurality of mounting holes to mount the hanging rail to the enclosure with screws, fasteners, bolts, nuts, rivets, other means, or a combination thereof. The cleat rail is offset from the enclosure rail so that the cleat rail can be hung onto a cleat formed the first rail when the wall rail is mounted to the surface. In some embodiments, the enclosure rail can be made of metal. In some embodiments, the hanging rail can be made of the same material as the wall rail. In some embodiments, the width of the enclosure rail may vary depending on the width of the enclosure being mounted.

A "rotary footing" is a device capable of securing the enclosure to the surface after the enclosure is hung onto the wall rail. In some embodiments, the rotary footing may be partially deformable to extend toward the surface to permit the rotary footing to mount to the surface. In some embodiments, the profile of the rotary footing matches the combined depth of the wall rail and hanging rail when the hanging rail is hung on the wall rail. In some embodiments, the rotary footing can be made of metal. In some embodiments, the rotary footing can be made of the same material as the wall rail. In other embodiments, the rotary footing can be made of the same material as the enclosure.

Figure 1:
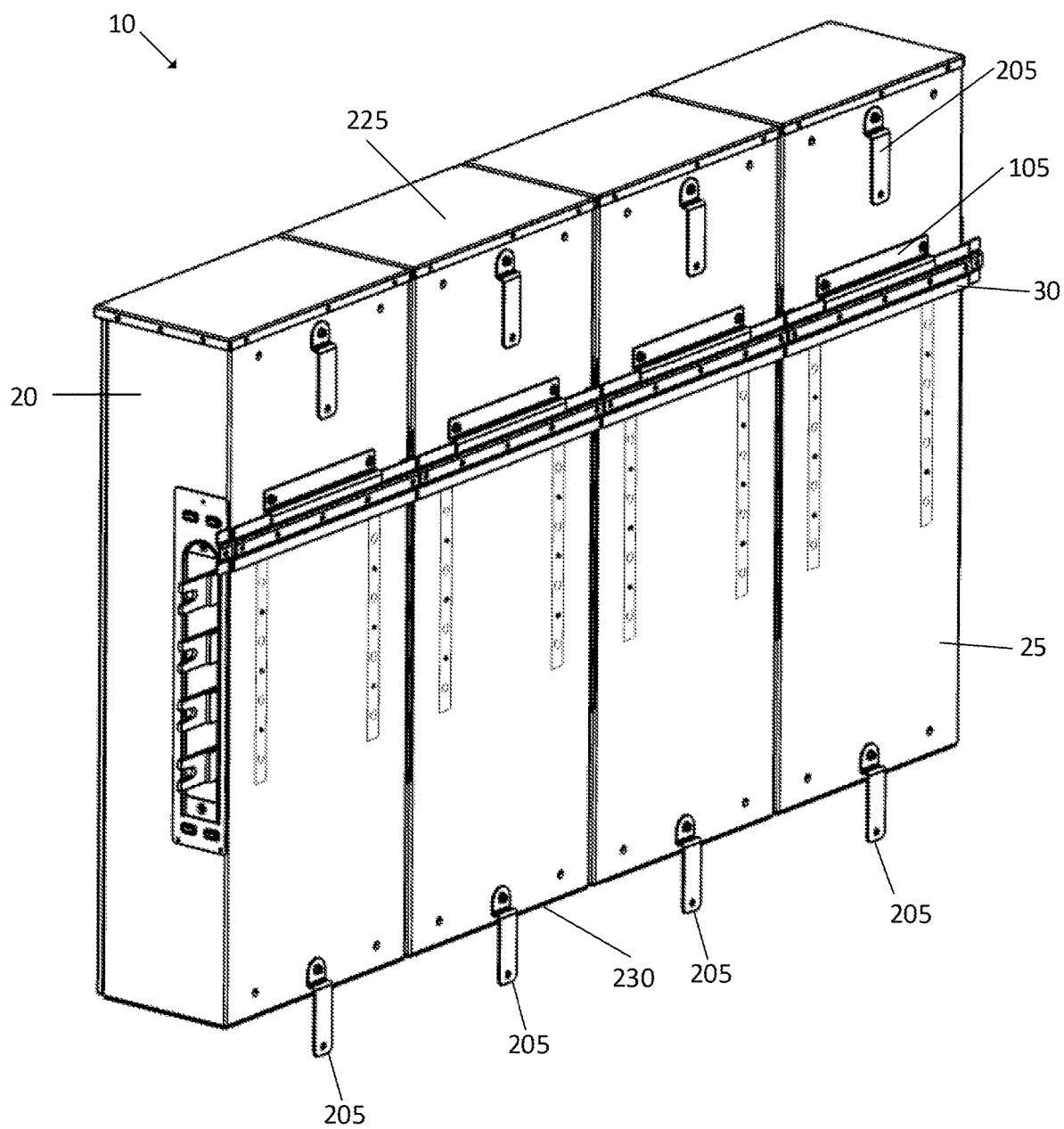
FIG. 1 is a perspective view of an enclosure mounting system, according to some embodiments.
Figure 2:
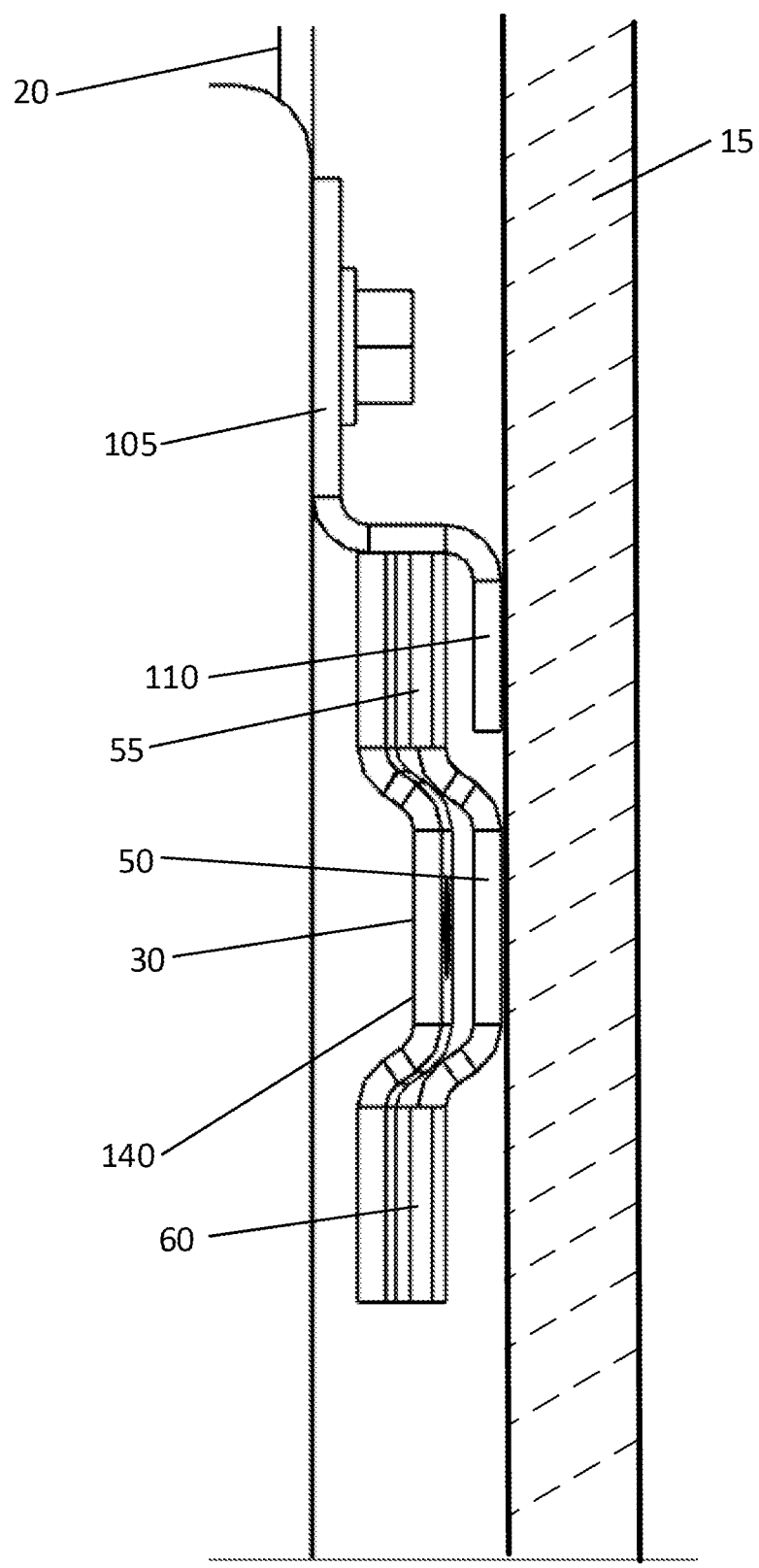
FIG. 2. is a side view of the enclosure mounting system, according to some embodiments.

FIG. 1 and FIG. 2 show different view of the enclosure mounting system 10, according to some embodiments, FIG. 1 is a perspective view of an enclosure mounting system 10, according to some embodiments. FIG. 2. is a side view of the enclosure mounting system 10, according to some embodiments. The enclosure mounting system 10 is configured to hang an enclosure 20 onto a surface 15. In some embodiments, the enclosure mounting system 10 includes a wall rail 30 and a hanging rail 105. The wall rail 30 extends from a first end 35 to a second end 40 and is configured to mount to the surface 15. The hanging rail 105 is configured to mount to the enclosure 20, and consequently hung on the wall rail 30. In some embodiments, the enclosure 20 can be of various dimensions suitable for being used as, but not limited to, an electrical enclosure. Accordingly, in some embodiments, the width of the wall rail 30 can vary based on the width of the enclosure 20.

Figure 3A:
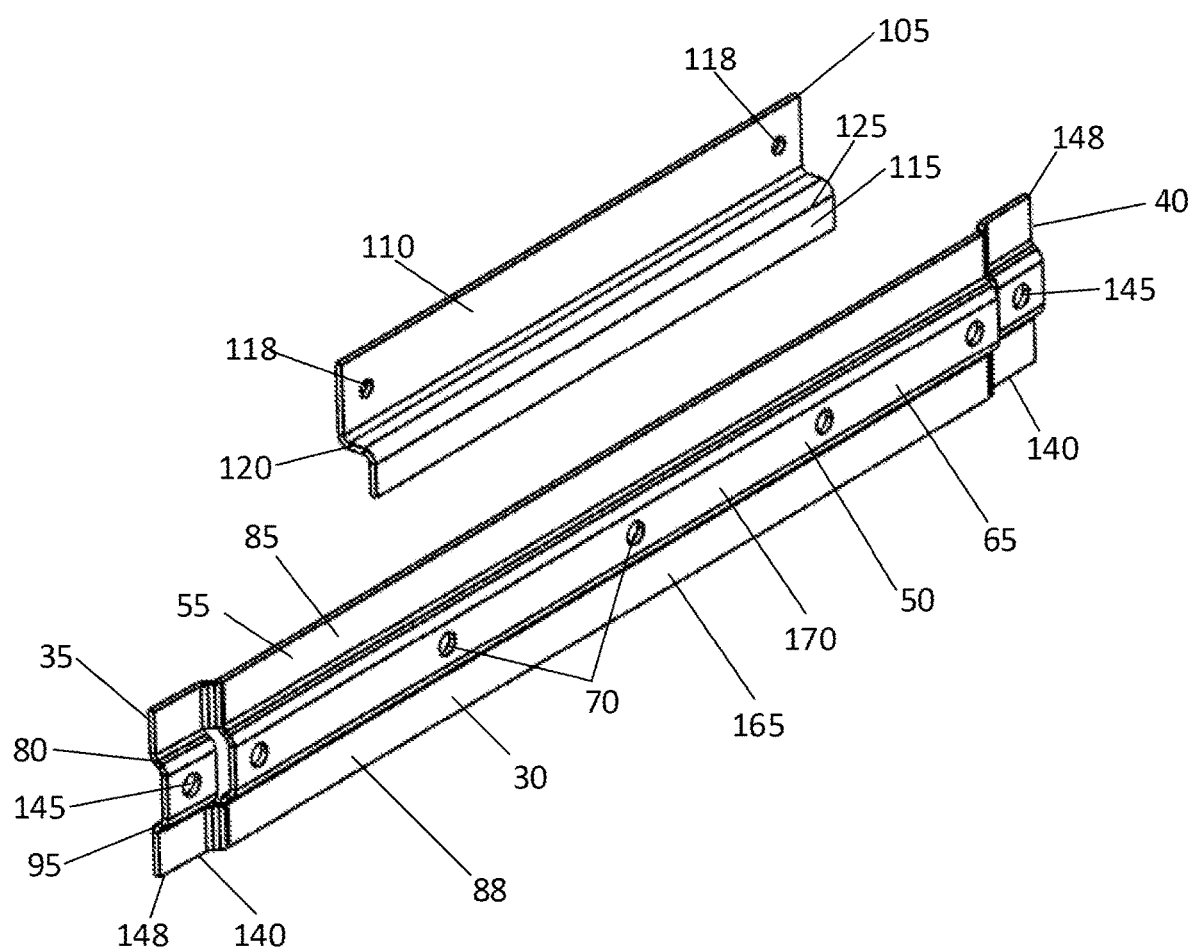
FIG. 3A is a perspective view of the wall rail and the hanging rail of the enclosure mounting system, according to some embodiments.
Figure 3B:
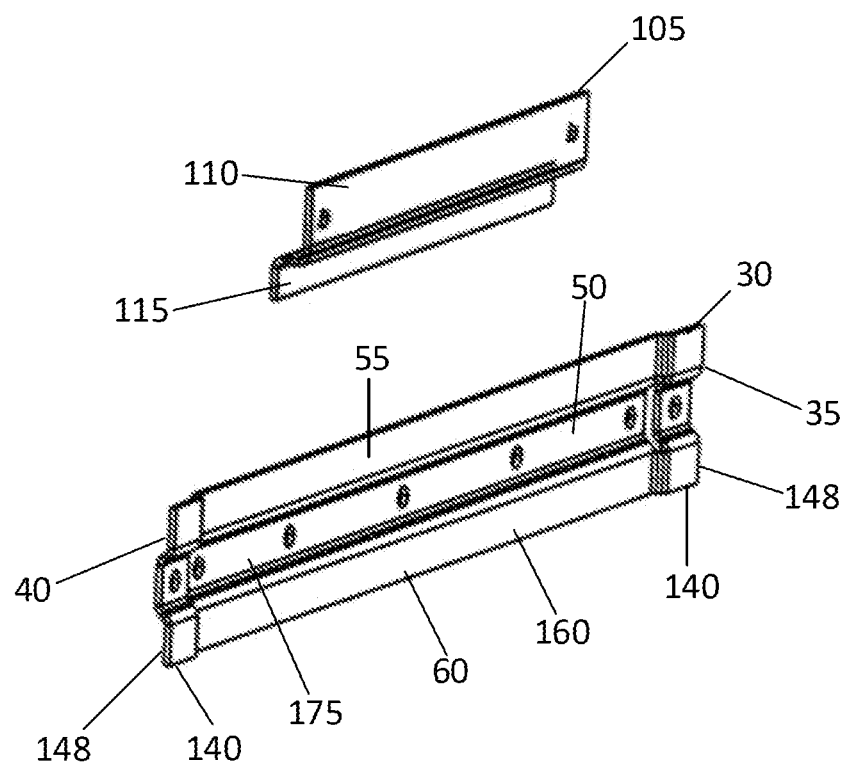
FIG. 3B is a perspective view of the wall rail and hanging rail, according to some embodiments.
Figure 4A:
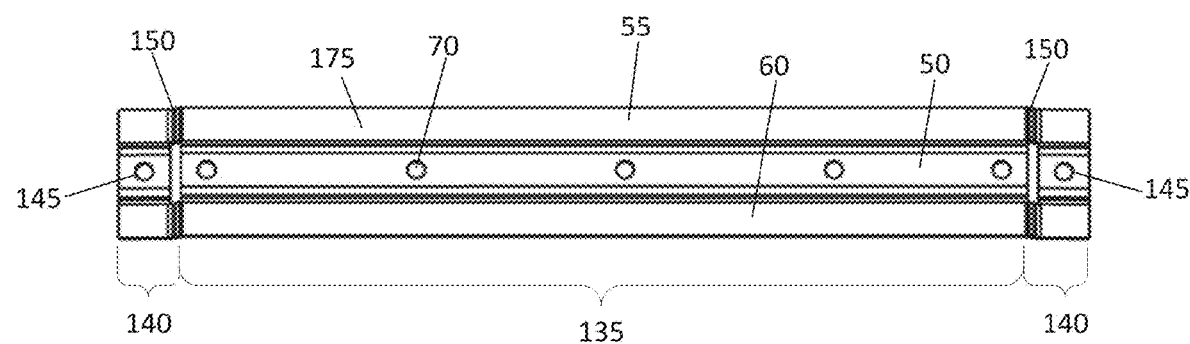
FIG. 4A is a front view of the wall rail, according to some embodiments.
Figure 4B:
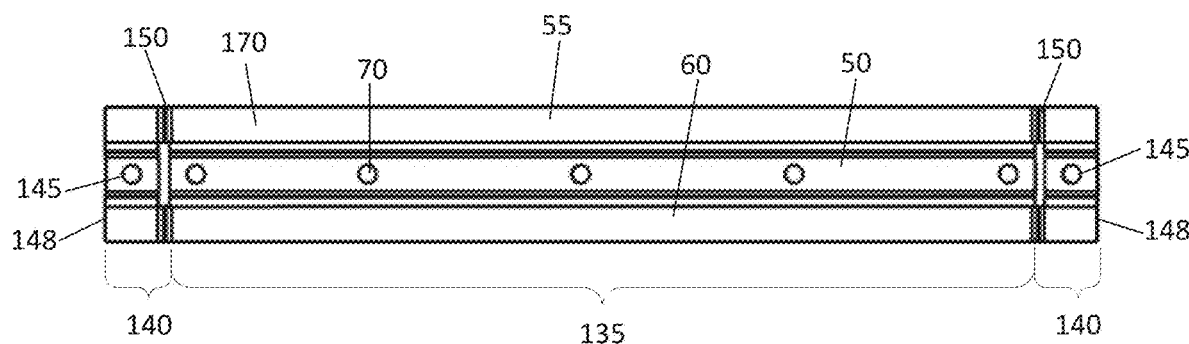
FIG. 4B is a rear view of the wall rail, according to some embodiments.
Figure 5:
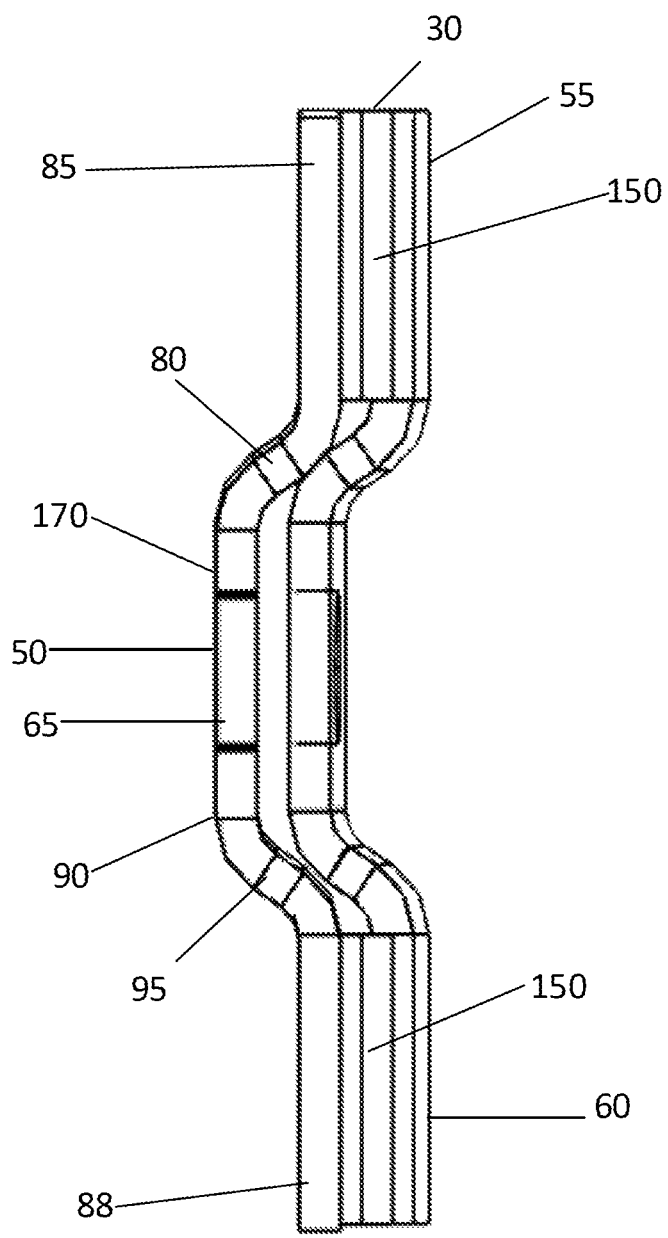
FIG. 5 is a side view of the wall rail, according to some embodiments.
Figure 6:
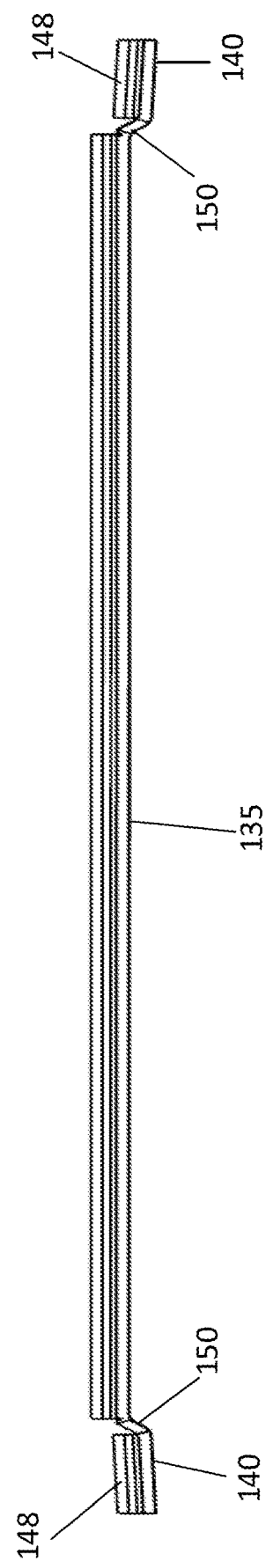
FIG. 6 is a top side view of the wall rail, according to some embodiments.

FIG. 3A-6 show different perspective views of the enclosure mounting system 10 of FIG. 1, according to some embodiments. FIG. 3A is a perspective view of the wall rail 30 and hanging rail 105 of the enclosure mounting system 10, according to some embodiments. FIG. 3B is a perspective view of the wall rail 30 and the hanging rail 105 of the enclosure mounting system 10, according to some embodiments. FIG. 4A is a front view of the wall rail 30, according to some embodiments. FIG. 4B is a rear view of the wall rail 30, according to some embodiments. FIG. 5 is a side view of the wall rail 30, according to some embodiments. FIG. 6 is a top view of the wall rail 30, according to some embodiments. FIGS. 3A-6 will be discussed generally, unless specific reference is made to a particular figure.

In some embodiments, the wall rail 30 can be one unitary body that includes a mounting rail 50, a first rail 55, a first offset 80, a second rail 60, and a second offset 95 extending from a first end 35 of the wall rail 30 to the second end 40 of the wall rail 30. The mounting rail 50 extends along the wall rail 30 on a first plane 65. The first offset 80 is disposed between the mounting rail 50 and the first rail 55, wherein the first rail 55 extends along the wall rail 30 on a second plane 85. The second offset 95 is disposed between the mounting rail 50 and the second rail 60, wherein the second rail 60 extends along the wall rail 30 on a third plane 88. In some embodiments, the first plane 65, the second plane 85, and the third plane 88 can be parallel. In some embodiments, the second plane 85 and the third plane 88 are on the same plane. In some embodiments, the second plane 85 and the third plane 88 are parallel. In some embodiments, the second plane 85 and the third plane 88 are not parallel nor on the same plane. In some embodiments, neither the second plane 85 nor the third plane 88 are parallel to the first plane 65. In some embodiments, the wall rail 30 forms a wave form pattern profile extending from the first end 35 to the second end 40. In some embodiments, the wall rail 30 can be multiple components that are welded together or connected by other means.

In some embodiments, the mounting rail 50, first rail 55, second rail 60, first offset 80, and the second offset 95 form a wave form pattern profile in the wall rail 30 that latitudinally extends from the first end 35 to the second end 40. In some embodiments, the wave pattern can be a square wave pattern, wherein the bends in the first offset 80 and the second offset 95 form 90° bends. In some embodiments, the bends of the first offset 80 and the second offset 95 can be rounded or partially rounded in profile. In other embodiments, the bends can be greater than 90° so that the first offset 80 and the second offset 95 angularly extend away from the mounting rail 50.

In some embodiments, the wave form pattern profile can be a square wave pattern wherein the angle of the first offset 80 and the second offset 95 is 90°. In some embodiments, the angle of the first offset 80 and the second offset 95 can be less than 90°. In other embodiments, the angle of the first offset 80 and the second offset 95 can be greater than 90°.

In some embodiments, the wall rail 30 is manufactured with a matching wave pattern profile so that when installing a plurality of wall rails 30 onto the surface 15, the adjoining wall rails 30 are aligned to the adjacent wall rails 30 along with all the other connected wall rails 30. Furthermore, in some embodiments, adjoining a second wall rail 30 onto a first wall rail 30 that was previously leveled and mounted to the surface 15 will align and level the second wall rail 30 and any subsequent wall rails 30 connected to the first wall rail 30 or any other wall rail 30 that is adjoined to the first wall rail 30.

In some embodiments, the wall rail 30 is configured to mount to a surface 15. In some embodiments, the wall rail 30 can include adhesive, glue, other means, and a combination thereof at least partially disposed on a first surface 170 of the wall rail 30 to mount the wall rail 30 to the surface 15. In some embodiments, the wall rail 30 can include a plurality of first sized bore 70 that extend through the surface of the mounting rail 50, equidistantly spaced apart from the first end 35 to the second end 40 of the wall rail 30. The plurality of first sized bore 70 are configured to receive any of a plurality of connectors to attach the wall rail 30 to the surface 15 including a screw, anchor, rivet, nut, bolt, other connectors, and a combination thereof. In some embodiments, the wall rail 30 is mounted to the surface 15 by abutting the first surface 170 of the mounting rail 50 to the surface 15 and installing a connector through at least one of the plurality of first sized bore 70 and into the surface 15, wherein the first rail 55 and the second rail 60 are spaced apart from the 15 to form a cleat.

In some embodiments, the number of first sized bore 70 on the mounting rail 50 of the wall rail 30 can vary depending on a variety of factors including, but not limited to, the width of the wall rail 30, the dimensions of the enclosure 20 being hung on the wall rail 30, the seismic tolerances required for hanging the enclosure 20, or other factors. In some embodiments, the first sized bore 70 on the wall rail 30 can be spaced a fixed distance apart along the width of the wall rail 30 to permit a user to install a plurality of connectors to securely hang the enclosure 20 to the surface 15.

In some embodiments, the wall rail 30 can be a central segment 135 and can further include at least one end segment 140. In some embodiments, the at least one end segment includes a fourth offset 150 and an end rail 148. In some embodiments, the central segment 135 can be the same, or substantially similar, width as the enclosure 20 being mounted to the wall rail 30, wherein the at least one end segment 140 extends out from a side of the enclosure 20 when the enclosure 20 is mounted to the wall rail 30. In some embodiments, the central segment 135 can be wider than the enclosure 20. In some embodiments, the central segment 135 can be narrower than the enclosure 20. In some embodiments, the wall rail 30 can include the central segment 135. In some embodiments, the wall rail 30 can include the central segment 135 and a first end segment 140 disposed at an end of the central segment 135. In some embodiments, the wall rail 30 can include the central segment 135, a first end segment 140 and a second end segment 140, wherein the first end segment 140 and the second end segment 140 are disposed at opposite ends of the central segment 135 to allow multiple wall rail 30 to be adjoined to a first wall rail 30.

In some embodiments, the fourth offset 150 is disposed between the central segment 135 and the end rail 148, wherein the end rail 148 extends on a plane parallel to the central segment 135. The end rail 148 can include at least one alignment bore 145 disposed at the mounting rail 50 portion of the end rail 148. The at least one alignment bore 145 is configured to align with a corresponding one of the plurality of first sized bore 70 of the central segment 135 when multiple wall rails 30 are adjoined together in a manner further described below. Further, in some embodiments, the at least one end segment 140 can be mounted to the surface 15 by inserting a connector through the at least one alignment bore 145 and into the surface 15. In some embodiments, the at least one end segment 140 angularly extends away from the plane of the central segment 135. Therefore, when the wall rail 30 is mounted to the surface 15, the at least one end segment 140 angularly extends away from the surface 15. The angle of the at least one end segment 140 permits a second wall rail 30 to be adjoined to the first wall rail 30 when the first wall rail 30 is mounted to the surface 15 by slidably inserting the central segment 135 of the second wall rail 30 into the gap formed between the at least one end segment 140 of the first wall rail 30 and the surface 15. In some embodiments, the at least one end segment 140 can extend away from the surface 15 at an angle between 2-5°. In some embodiments, the at least one end segment 140 can extend away from the surface 15 at an angle between 0.1-2°. In some embodiments, the at least one end segment 140 can extend away from the surface at an angle between 5-10°. In some embodiments, the at least one end segment 140 can extend away from the surface at an angle between 10-15°. In some embodiments, the at least one end segment 140 can extend away from the surface at an angle between 15-20°. In some embodiments, the at least one end segment 140 can extend away from the surface at an angle between 20-25°. In some embodiments, the at least one end segment 140 can extend away from the surface at an angle between 25-30°.

In some embodiments, the profile of the wall rail 30, specifically, the wave pattern profile of the wall rail 30, provides for the automatic alignment and leveling of subsequently installed wall rails 30. For example, a first wall rail 30 having a central segment 135 and at least one end segment 140 can be installed onto the surface 15. Then, a second wall rail 30 having an exposed central segment 135 can be inserted into the opening formed by the at least one end segment 140 and the surface 15 of the first wall rail 30 wherein the wave pattern profile of the second wall rail 30 corresponds to the wave pattern of the first wall rail 30 so that a portion of the first surface 170 of the first wall rail 30 contiguously abuts a portion of the second surface 175 of the adjoining second wall rail 30. The central segment 135 of the second wall rail 30 is inserted the opening between the at least one end segment 140 of the first wall rail 30 and the surface until the at least one alignment bore 145 of the end rail 148 aligns with one of the plurality of first sized bore 70 of the central segment 135 of the second wall rail 30. In some embodiments, the second wall rail 30 is securely connected to the first wall rail 30 by installing a connector through the at least one alignment bore 145 of the first wall rail 30, the corresponding one of the plurality of first sized bore 70 of the second wall rail 30, and into the surface 15. In some embodiments, the adjoining first wall rail 30 and the second wall rail 30 are substantially aligned and leveled when the second wall rail 30 is inserted into the at least one end segment 140 of the first wall rail 30. In some embodiments, the second wall rail 30 can be further secured and aligned to the first wall rail 30 by installing a connector through the at least one end segment 140 of the first wall rail 30, the corresponding one of the plurality of first sized bore 70 of the central segment 135 and into the surface 15.

Figure 7:
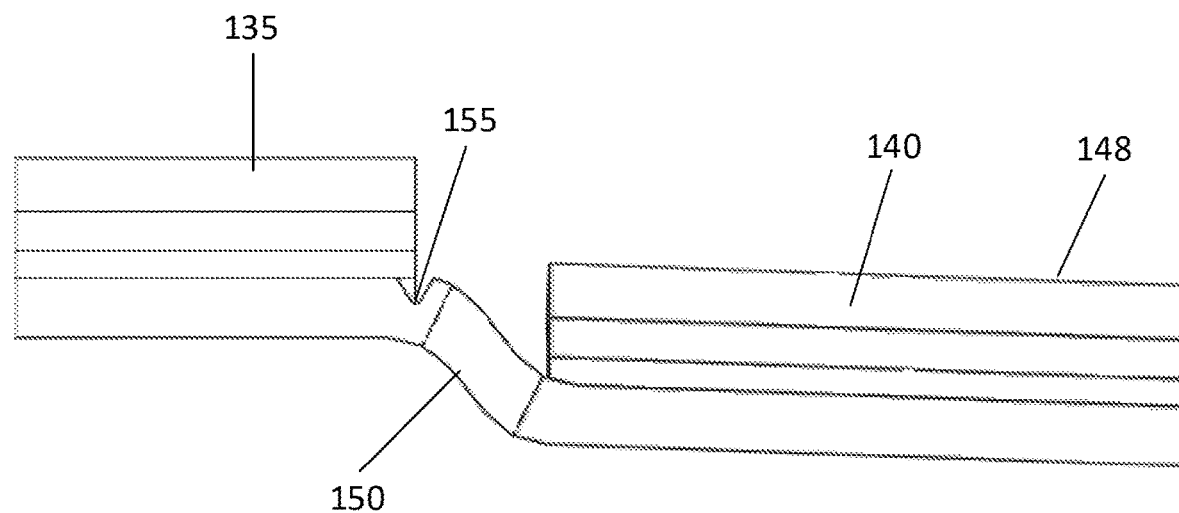
FIG. 7 is a partial top view of the wall rail, according to some embodiments.
Figure 8:
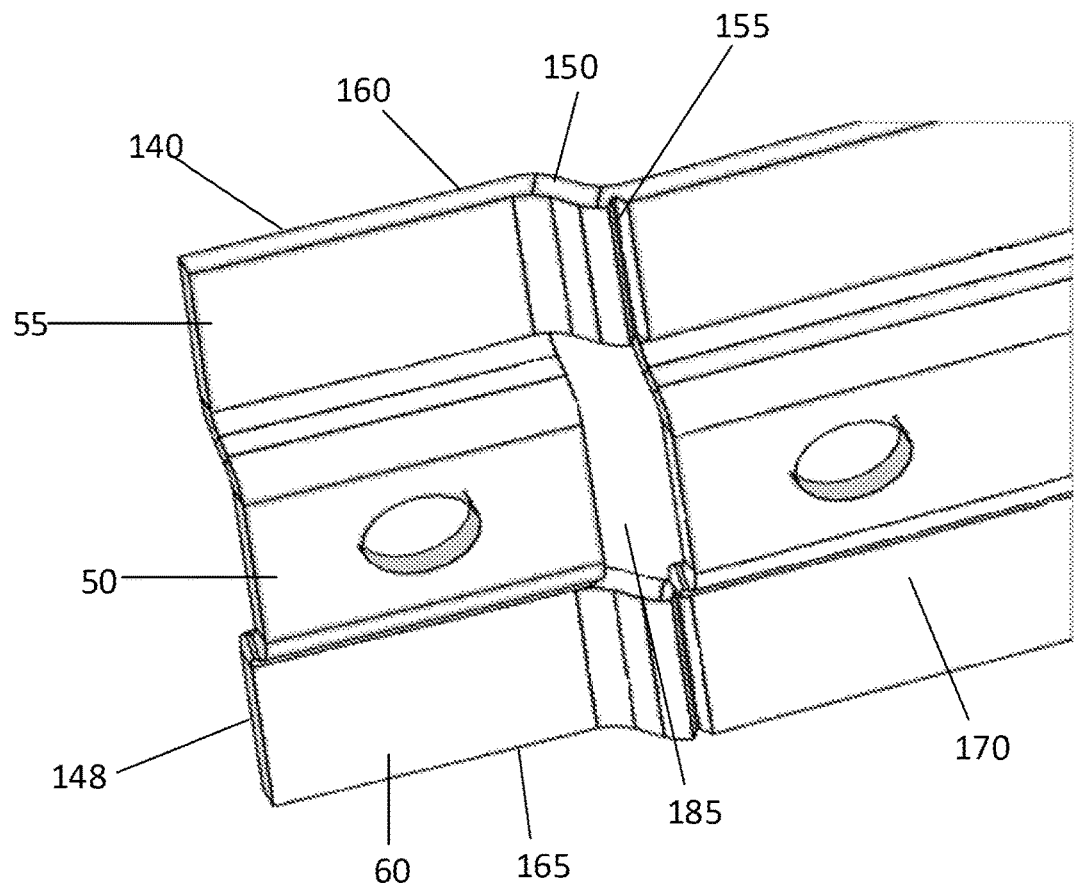
FIG. 8 is a partial perspective view of the wall rail, according to some embodiments.

FIGS. 7 and 8 show different views of the wall rail 30 of FIG. 1, according to some embodiments. FIG. 7 is a partial top view of the wall rail, according to some embodiments. FIG. 8 is a partial perspective view of the wall rail, according to some embodiments. FIGS. 7 and 8 will be discussed generally, unless specific reference is made to a particular figure.

In some embodiments, the central segment 135 of the wall rail 30 can include a channel 155 disposed on the first surface 170 of the wall rail 30 that extends across the first rail 55 and the second rail 60 at either the first end 35 or the second end 40 of the central segment 135. In some embodiments, the channel 155 can be configured to detach the at least one end segment 140 from the central segment 135 in response to a shearing force, thereby leaving the first end 35 or second end 40 of the central segment 135 exposed. In some embodiments, the channel 155 can have a depth of 0.04". In some embodiments, the depth of the channel 155 can be greater than 0.04". In some embodiments, the depth of the channel 155 can be less than 0.04".

In some embodiments, the channel 155 can be a line of perforations that travels from a first side 160 of the wall rail 30 to the second side 165. In some embodiments, the channel 155 can be a pair of slots located on the end of the central segment 135 at the first rail 55 and the second rail 60, wherein the at least one end segment 140 is connected to the central segment 135 by tabs that are configured to break apart the at least one end segment 140 from the central segment 135 in response to the shearing force.

In some embodiments, the fourth offset 150 can include a slot 185 (FIG. 7) wherein the mounting rail 50 portion is removed from the fourth offset 150. This slot 185 (FIG. 7) is defined by the first rail 55, the second rail 60, the central segment 135, and the end rail 148. The slot 185 (FIG. 7) permits the at least one end segment 140 to detach from the first end 35 or the second end 40 of the central segment 135 in a manner further described below.

In some embodiments, because the slot 185 is defined by the end of the central segment 135, the end rail 148, the first rail 55, and the second rail 60, when the at least one end segment 140 is removed from the wall rail 30 at the channel 155, the first rail 55 and the second rail 60 detaches at the channel 155 of the central segment 135 to remove the at least one end segment 140. For example, a user may use any of a plurality a hand tools, or by hand, to work the at least one end segment 140, at the channel 155, until the at least one end segment 140 detaches from the wall rail 30, thereby exposing an end of the central segment 135. In some embodiments, the channel 155 is of a depth to permit a user to detach the at least one end segment 140 from the wall rail 30, while providing enough structural rigidity and strength when still attached to the central segment 135 to receive and retain an adjoining wall rail 30. In some embodiments, when the at least one end segment 140 is detached from the first end 35 or the second end 40 of the central segment 135, the end of the central segment 135 is partly formed by a portion of the channel 155.

In some embodiments, a method for installing the enclosure mounting system 10 includes installing a wall rail 30 having at least one end segment 140 onto a surface 15 by positioning the first wall rail 30 at the desired location and leveling the wall rail 30 on the surface; securing the first wall rail 30 to the surface 15 by installing a connector through at least one of the plurality of first sized bore 70 of the central segment 135 of the first wall rail 30; removing at least one end segment 140 of a second wall rail 30; inserting the now exposed central segment 135 of the second wall rail 30 into the space between the at least one end segment 140 of the first wall rail 30 and the surface 15 wherein the profile of the first wall rail 30 matches the profile of the second wall rail 30 until the corresponding one of the plurality of first sized bore 70 of the central segment 135 is aligned with the at least one alignment bore 145 of the at least one end segment 140; and adjoining the second wall rail 30 to the first wall rail 30 by inserting a connector through the at least one alignment bore 145 of the at least one end segment 140 of the first wall rail 30, the corresponding one of the plurality of first sized bore 70 of the central segment 135 of the second wall rail 30, and the surface 15. In some embodiments, securing the connector through the at least one end segment 140 of the first wall rail 30, the central segment 135 of the second wall rail 30, and the surface 15 further aligns the second wall rail 30 to the first wall rail 30. In some embodiments, the at least one end segment 140 is configured to slightly mechanically deform or bend in response to the at least one end segment 140 being screwed onto the surface 15 so that the at least one end segment 140 no longer angularly extends away from the surface 15, but rather extends parallel to the surface 15, abutting the central segment 135 of the second wall rail 30.

Figure 9A:
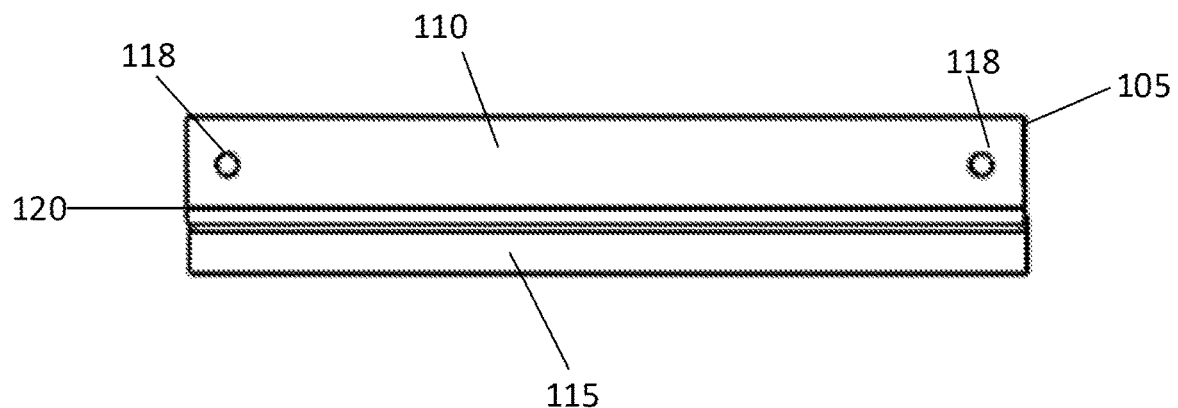
FIG. 9A is a front view of the hanging rail, according to some embodiments.
Figure 9B:
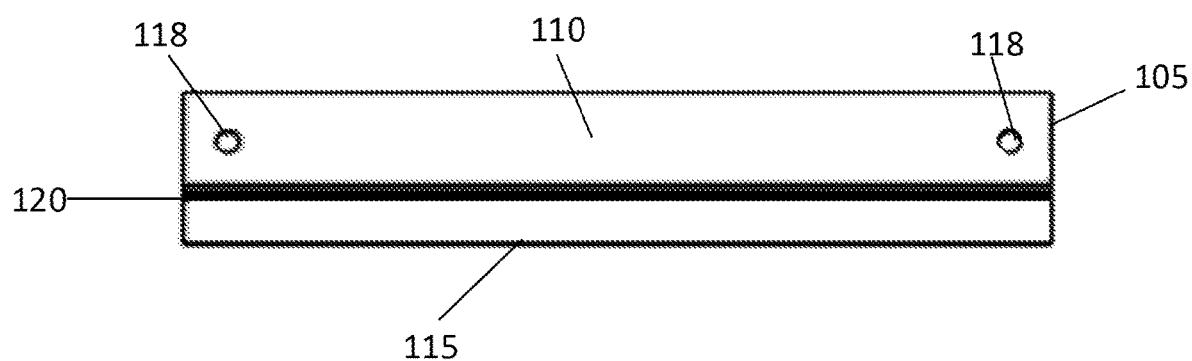
FIG. 9B is a rear view of the hanging rail, according to some embodiments.
Figure 10:
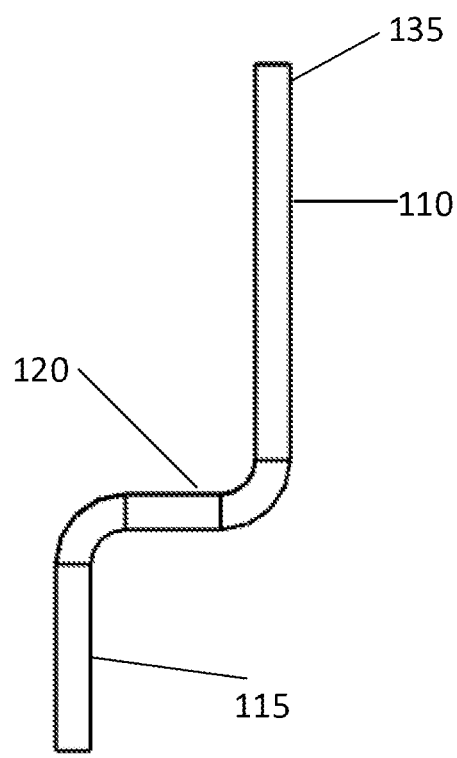
FIG. 10 is a side view of the hanging rail, according to some embodiments.
Figure 11:
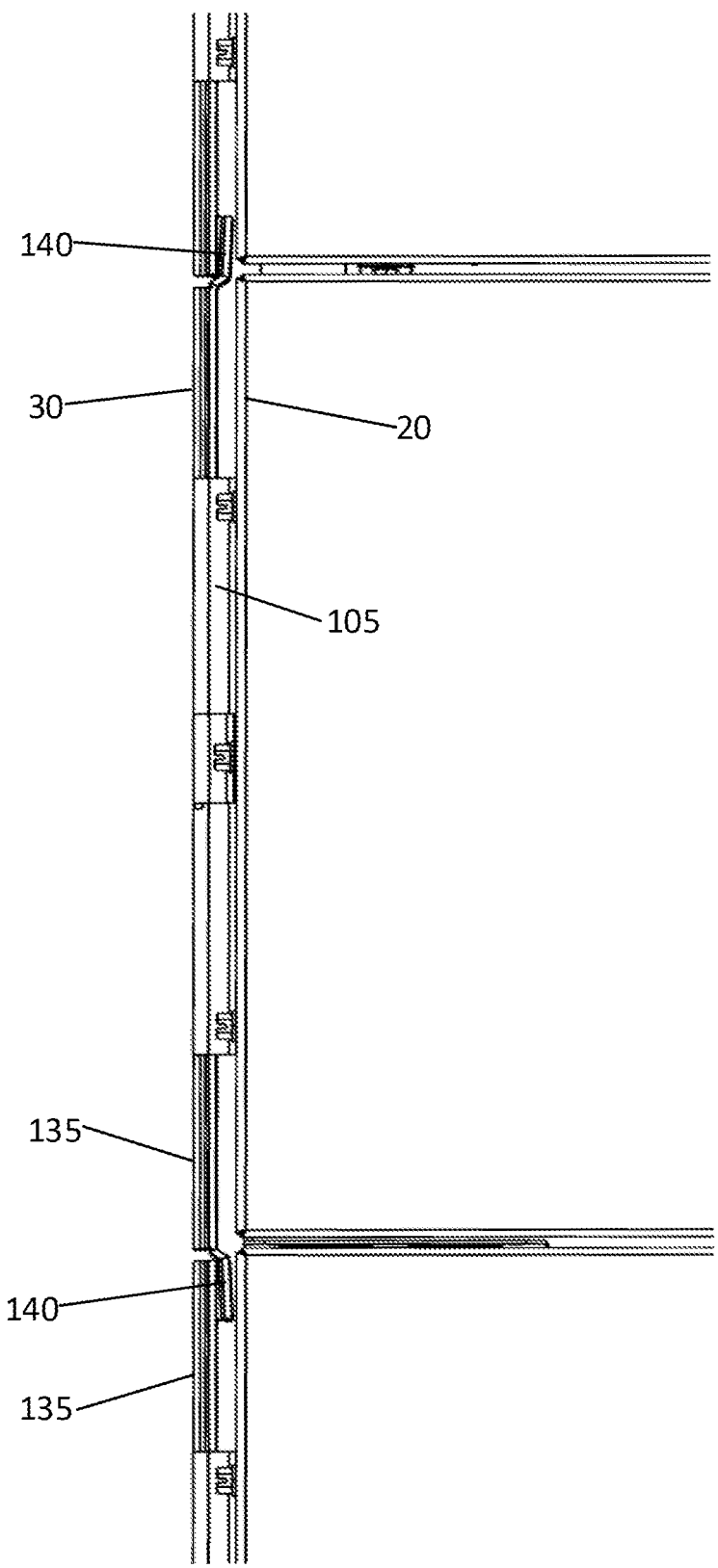
FIG. 11 is a top view of the enclosure mounting system, according to some embodiments.

FIGS. 9A, 9B, and 10 show different views of the hanging rail 105 of FIG. 1, according to some embodiments. FIG. 9A is a front view of the hanging rail 105, according to some embodiments. FIG. 9B is a rear view of the hanging rail 105, according to some embodiments. FIG. 10 is a side view of the hanging rail 105, according to some embodiments.

In some embodiments, the hanging rail 105 includes an enclosure rail 110, a third offset 120, and a cleat rail 115. In some embodiments, the enclosure rail 110 can include a plurality of second sized bores 118 equidistantly spaced across the enclosure rail 110 and is configured to mount the hanging rail 105 to a rear surface 25 of the enclosure 20. The enclosure rail 110 can be secured to the rear surface 25 of the enclosure 20 with a screw, nut, bolt, anchor, rivets, washers, other mounting means, and a combination thereof. In some embodiments, the third offset 120 is disposed between the enclosure rail 110 and the cleat rail 115 such that the cleat rail 115 extends on a fourth plane 130 that is parallel to the enclosure rail 110. In some embodiments, the cleat rail 115 extends on a fourth plane 130 that is not parallel to the enclosure rail 110. Accordingly, in some embodiments, the cleat rail 115 forms a hanging cleat wherein the cleat rail 115 is configured to be inserted into the ledge formed between the surface 15 and the first rail 55 of the wall rail 30 mounted to the surface 15 to hang the enclosure 20 to the surface 15 and the wall rail 30. In some embodiments, the third offset 120 of the hanging rail 105 forms a step, wherein the bends of the third offset 120 form 90° bends with the enclosure rail 110 and the cleat rail 115. In some embodiments, the third offset 120 can angularly extend away from the enclosure rail 110, wherein the angle formed by the third offset 120 with the enclosure rail 110 and the cleat rail 115 is greater than 90°.

In some embodiments, the hanging rail 105 can be the same width as the enclosure 20 or the wall rail 30. In other embodiments, the hanging rail 105 can be narrower than the enclosure 20 or the wall rail 30. In some embodiments, the hanging rail 105 can include an enclosure rail 110 and a cleat rail 115.

In some embodiments, the hanging rail 105 is narrower than the wall rail 30 so that the hanging rail 105 and the attached enclosure 20 can slidably move along the ledge of the first rail 55 of the wall rail 30 to allow for ease of installation and to allow for adjusting the positioning of the enclosure 20 along the wall rail 30. Once the desired position of the enclosure 20 along the wall rail 30 is determined, the enclosure 20 can then be securely mounted to the surface 15 by mounting the rotary footing 205 to the surface 15 with a screw, bolt, nut, washer, anchor, rivet, other means, and a combination thereof.

In some embodiments, the components of the enclosure mounting system 10 are made of materials with sufficient strength and rigidity to withstand mechanical deformation as a result of being mounted to the surface 15 and having an enclosure hung onto the wall rail 30. In some embodiments, the wall rail 30 and the hanging rail 105 can have a material thickness of 11 gauge. In some embodiments, the material thickness of the wall rail 30 and the hanging rail 105 can be less than 11 gauge. In some embodiments, the material thickness of the wall rail 30 and the hanging rail 105 can be greater than 11 gauge.

In some embodiments, when the wall rail 30 includes a central segment 135, multiple wall rails 30 can be installed onto the surface 15 and aligned with respect to a first wall rail 30 by installing and leveling the first wall rail 30 to the surface. The subsequent wall rails 30 can be connected and aligned to the first wall rail 30 by using a jig that can have the same wave form pattern profile as the wall rail 30, wherein the second wall rail 30 is positioned adjacent to the first wall rail 30 and the jig is positioned over the abutting ends of the first and second wall rails 30 so that the second wall rail 30 is aligned and level with the first wall rail 30. Then, the second wall rail 30 can be mounted to the surface 15 by installing the connector through one of the plurality of first sized bore 70 of the second wall rail 30 to securely mount the second wall rail 30 to the surface 15. In some embodiments, the jig can be an end segment 140 with at least one alignment bore 145 so that when the jig is placed over abutting segments of the first wall rail 30 and the second wall rail 30, the connector inserted through the at least one alignment bore 145 and into the corresponding one of the plurality of first sized bore 70 of the central segment 135 of either the first or second wall rail 30 securely aligns and mounts the second wall rail 30 to the surface 15.

In some embodiments, when multiple wall rails 30 are installed onto the surface 15, the adjoining wall rails 30 are substantially aligned and leveled to their neighboring wall rails 30. In some embodiments, the adjoining wall rails 30 can be off level from the adjoining wall rail 30. In some embodiments, adjoining wall rails 30 may be off level by 0-0.5°. In some embodiments, adjoining wall rails 30 may be off level by 0.5-1°. In some embodiments, adjoining wall rails 30 may be off level by 1-1.5°. In some embodiments, adjoining wall rails 30 may be off level by 1.5-2°. In some embodiments, adjoining wall rails 30 may be off level by 2-2.5°. In some embodiments, adjoining wall rails 30 may be off level by 2.5-2.8°. In some embodiments, adjoining wall rails 30 may not be off level by more than 2.8° without affecting the alignment of adjoining enclosures. In some embodiments, adjoining wall rails 30 may be off by level by 2.8-5° without affecting the alignment of adjoining enclosures.

Figure 12:
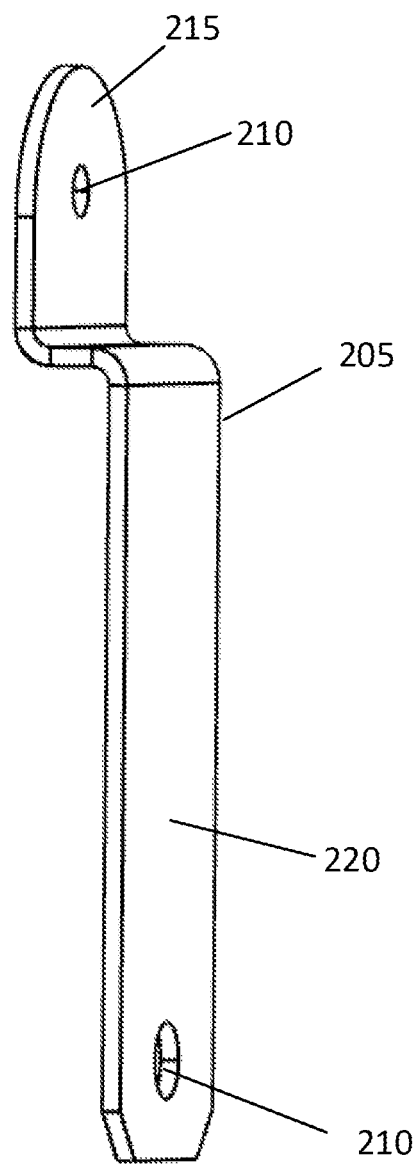
FIG. 12 is a perspective view of the rotary footings, according to some embodiments.

FIG. 12 is a perspective view of the rotary footing 205, according to some embodiments. In some embodiments, the rotary footing 205 are a pair of rotary footing 205. The rotary footing 205 are installed onto a first end 225 (FIG. 1) and a second end 230 (FIG. 1) of the enclosure 20 to securely mount the enclosure 20 to the surface 15 after the enclosure 20 is hung on the wall rail 30. In some embodiments, the rotary footing 205 can be installed proximate to the first end 225 and the second end 230 of the enclosure 20 on the rear surface 25 of the enclosure 20. The rotary footing 205 can include at least two mounting bores 210. A first mounting bore 210 is located on a first portion 215 that contacts a surface of the enclosure 20. A second mounting bore 210 is located on a second portion 220 that contacts the surface 15. The rotary footings 205 can be installed onto either the enclosure 20 or the surface 15 by any of a plurality of means including, but not limited to, a screw, a nut, bolt, anchor, rivets, washers, other means, and a combination thereof.

In some embodiments, the rotary footing 205 can have a plurality of mounting bores 210 on the first portion 215 and the second portion 220 of the rotary footing 205 to provide a more stable connection or to provide for space limitations. For example, if there is a limited window of space to install the rotary footing 205 either above or below the enclosure 20 so that an installer would not be able to secure the rotary footing 205 to the surface 15 if there was one mounting bore 210 on the second portion 220 of the rotary footing 205. Accordingly, the installer could use any of a plurality of mounting bores 210 to secure the rotary footing 205 to the surface 15.

The terminology used herein is intended to describe embodiments and is not intended to be limiting. The terms "a," "an," and "the" include the plural forms as well, unless clearly indicated otherwise. The terms "comprises" and/or "comprising," when used in this Specification, specify the presence of the stated features, integers, steps, operations, elements, and/or components, but do not preclude the presence or addition of one or more other features, integers, steps, operations, elements, and/or components.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

The invention claimed is:

1. A system comprising:
a wall rail comprising:
a first end,
a second end,
a mounting rail extending along a first plane from the first end to the second end, the mounting rail comprising:
a first side, and
a second side,
a first offset connected to the mounting rail on the first side,
a first rail connected to the first offset opposite the mounting rail and extends along a second plane parallel to the first plane,
a second offset connected to the mounting rail on the second side, and
a second rail connected to the second offset opposite the mounting rail and
the first rail and extends along a third plane parallel to the first plane,
wherein the wall rail is a central segment and the wall rail further comprises:
at least one end segment comprising:
a fourth offset connected to the central segment on a first end or a second end of the central segment, and
an end rail,
wherein the at least one end segment is connected to either the first end or the second end of the central segment,
a channel,
wherein the channel is disposed between the central segment and the at least one end segment,
wherein the channel is configured to detach the at least one end segment in response to a shearing force, and
a slot,
wherein the slot is disposed at the fourth offset between the first rail and the second rail,
wherein the at least one end segment angularly extends away from a surface when the wall rail is mounted to the surface,
wherein when the shearing force is applied to the at least one end segment, the at least one end segment breaks off from the central segment at the channel and the slot,
wherein the wall rail forms a wave form pattern extending from the first end to the second end of the wall rail; and
a hanging rail comprising:
an enclosure rail,
a third offset connected to a first side of the enclosure rail, and
a cleat rail connected to the third offset opposite the enclosure rail; and
wherein the wall rail is configured to mount to the surface;
wherein the hanging rail is configured mount to the wall rail by inserting the cleat rail into a cleat formed by the wall rail when the wall rail is mounted to the surface.

2. The system of claim 1, the system further comprising:
an enclosure,
wherein the enclosure is configured to be attached to the enclosure rail and mounted to the surface by hanging the enclosure rail onto the wall rail.

3. The system of claim 2, wherein the enclosure rail further includes:
a first end,
a second end, and
a plurality of bores extending through a surface of the enclosure rail from the first end and the second end,
wherein the bores are configured to receive a plurality of connectors to attach the hanging rail to the enclosure.

4. The system of claim 2, wherein the central segment is a same width as the enclosure, and wherein the at least one end segment extends from a first side or a second side of the enclosure.

5. The system of claim 1, wherein the central segment of a first wall rail is mounted to the surface and the system further comprises:
a second wall rail,
wherein a central segment of the second wall rail is inserted into an opening formed between the at least one end segment of the first wall rail and the surface such that a wave form pattern profile of the second wall rail matches the first wall rail,
wherein the second wall rail aligns with the first wall rail due to the matching wave form pattern profile of the first wall rail and the second wall rail, wherein the second wall rail is further aligned to the first wall rail when the at least one end segment of the first wall rail is mounted to the surface.

6. The system of claim 1, wherein the at least one end segment is a first end segment and a second end segment,
wherein the first end segment is disposed at the first end of the central segment,
wherein the second end segment is disposed at the second end of the central segment.

7. The system of claim 6, wherein the wall rail is a first wall rail mounted to the surface and the system further comprises:
a second wall rail,
wherein the first end segment or the second end segment is detached from the second wall rail to expose a first end or a second end of a central segment of the second wall rail,
wherein the first end or the second end of the central segment of the second wall rail is inserted into the first end segment or the second end segment of the first wall rail,
wherein the first wall rail and the second wall rail are aligned due to a matching wave form profile of the first wall rail and the second wall rail, and
wherein the second wall rail is further aligned to the first wall rail by mounting the first end segment or the second end segment that has received the second wall rail to the surface.

8. The system of claim 2, wherein the system further comprises:
a pair of rotary footing mounts,
wherein the rotary footing mounts are disposed on a rear surface of the enclosure.

9. The system of claim 1, wherein the mounting rail further includes:

a plurality of bores,
  wherein the plurality of bores extends through the surface of the mounting rail and are disposed from the first end to the second end of the wall rail, and
  wherein the plurality of bores are configured to receive a plurality of connectors to mount the wall rail to the surface.

10. An apparatus comprising:
a wall rail comprising:
  a mounting rail comprising:
    a plurality of bores extending through the mounting rail and disposed along the mounting rail,
    wherein the mounting rail extends on a first plane,
  a first rail comprising:
    a first offset,
    wherein the first rail is connected to the mounting rail and extends on a second plane parallel to the first plane, and
  a second rail comprising:
    a second offset,
    wherein the second rail is connected to the mounting rail opposite the first rail and the second rail extends on a third plane parallel to the first plane,
  wherein the mounting rail, first rail, and the second rail forms a wave form pattern profile extending across the wall rail,
  wherein the wall rail is configured to mount to a surface,
  wherein the wall rail is a central segment and further comprises:
    at least one end segment comprising:
      a fourth offset, and
      an end rail,
      wherein the at least one end segment is connected to an end of the central segment at the fourth offset,
      wherein the end rail includes at least one alignment bore disposed on a mounting rail portion of the end rail,
      wherein the at least one end segment is connected to an end of the central segment at the fourth offset and angularly extends away from the central segment,
    a channel,
      wherein the channel is disposed between an end of the central segment and the at least one end segment,
      wherein the channel is configured to detach the at least one end segment from the central segment in response to a shearing force, and
    a slot,
      wherein the slot is disposed at the fourth offset and is defined by the first rail, the second rail, the central segment, and the at least one end segment,
      wherein the slot is configured to aid in detaching the at least one end segment from the wall rail in response to the shearing force;
a hanging rail comprising:
  an enclosure rail,
    wherein the enclosure rail extends on a fourth plane, and
  a cleat rail,
    wherein the cleat rail is offset from the enclosure rail and extends on a fifth plane parallel to the fourth plane;
  wherein the hanging rail is configured to mount to the surface by inserting the cleat rail into a cleat formed when the wall rail is mounted to the surface.

11. The apparatus of claim 10, wherein the apparatus further comprises:
  an enclosure, wherein the enclosure is configured to mount to the enclosure rail.

12. The apparatus of claim 11, wherein the central segment of the wall rail is a same width as a width of the enclosure and wherein the at least one end segment extends out from a first side or a second side of the enclosure.

13. The apparatus of claim 10, wherein the at least one end segment is a first end segment and a second end segment, and
  wherein the first end segment is disposed at the first end of the central segment,
  wherein the second end segment is disposed at the second end of the central segment.

14. The apparatus of claim 13, wherein the wall rail is a first wall rail mounted to the surface and the apparatus further comprises:
  a second wall rail,
    wherein a first end segment or a second end segment is detached from the second wall rail to expose a first end or a second end of the second wall rail,
    wherein the first end or the second end of the second wall rail is inserted into a first end segment or a second end segment of the first wall rail,
    wherein the first wall rail and the second wall rail are aligned due to a matching wave form profile of the first wall rail and the second wall rail,
    wherein the second wall rail is further aligned to the first wall rail by mounting the first end segment or the second end segment retaining the second wall rail to the surface.

15. The apparatus of claim 11, wherein the apparatus further comprises:
  a pair of rotary footing mounts,
    wherein the rotary footing mounts are disposed on a rear surface of the enclosure.

16. The apparatus of claim 12, wherein the enclosure rail further includes:
  a first end,
  a second end, and
  a plurality of bores extending through a surface of the enclosure rail disposed from the first end to the second end,
  wherein the bores are configured to receive a plurality of connectors to attach the hanging rail to the enclosure.

17. The apparatus of claim 10, wherein the wall rail is a first wall rail and the apparatus further includes:
  a second wall rail, and
  a jig having a same profile as the first wall rail and the second wall rail,
  wherein the first wall rail is mounted and aligned on the surface,
  wherein the second wall rail is aligned to the first wall rail and mounted to the surface by interconnecting the jig onto an adjoining first end and second end of each of the first wall rail and the second wall rail and mounting the second wall rail to the surface.

18. The apparatus of claim 11, wherein the apparatus further comprises:
  a pair of rotary footing mounts,
    wherein the rotary footing mounts are disposed on a rear surface of the enclosure and configured to mount to the surface when the enclosure is hung on the wall rail.

* * * * *